US007067430B2

(12) United States Patent
Maa et al.

(10) Patent No.: US 7,067,430 B2
(45) Date of Patent: Jun. 27, 2006

(54) METHOD OF MAKING RELAXED SILICON-GERMANIUM ON INSULATOR VIA LAYER TRANSFER WITH STRESS REDUCTION

(75) Inventors: Jer-Shen Maa, Vancouver, WA (US);
Jong-Jan Lee, Camas, WA (US);
Douglas J. Tweet, Camas, WA (US);
Sheng Teng Hsu, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 266 days.

(21) Appl. No.: 10/677,005

(22) Filed: Sep. 30, 2003

(65) Prior Publication Data

US 2005/0070115 A1     Mar. 31, 2005

(51) Int. Cl.
*H01L 21/302*     (2006.01)
(52) U.S. Cl. .................. 438/705; 438/455; 438/458; 438/514; 438/690
(58) Field of Classification Search .............. 438/455, 438/458, 514, 690, 705
See application file for complete search history.

(56) References Cited

U.S. PATENT DOCUMENTS 6,767,802 B1 *   7/2004   Maa et al. ............... 438/406
6,825,086 B1 *  11/2004   Lee et al. ............... 438/294

(Continued)

OTHER PUBLICATIONS

K. Kim et al., *Strained Si for sub-100 nm MOSFETs*, Proceedings of the 3rd International Conference on SiGe Epitaxy and Heterostructures, Sante Fe, New Mexico, Mar. 9-12, 2002, p. 125.
M. Bruel et al., *Smart-Cut: A New Silicon On Insulator Material Technology Based on Hydrogen Implantation and Wafer Bonding*, Jpn. J. Appl. Phys., vol. 36, 1636 (1997).
Z.-Y. Cheng et al., *SiGe-on insulator (SGOI): Substrate Preparation and MOSFET Fabrication for Electron Mobility Evaluation*, 2001 IEEE International SOI Conference Proceedings p. 13.

(Continued)

*Primary Examiner*—George A. Goudreau
(74) *Attorney, Agent, or Firm*—Robert D. Varitz, P.C.

(57) ABSTRACT

A method of forming a silicon-germanium layer on an insulator includes depositing a layer of silicon-germanium on a silicon substrate to form a silicon/silicon-germanium portion; implanting hydrogen ions into the silicon substrate between about 500 Å to 1 μm below a silicon-germanium/silicon interface; bonding the silicon/silicon-germanium portion to an insulator substrate to form a couplet; thermally annealing the couplet in a first thermal annealing step to split the couplet; patterning and etching the silicon-germanium-on-insulator portion to remove portions of the silicon and SiGe layers; etching the silicon-germanium-on-insulator portion to remove the remaining silicon layer; thermally annealing the silicon-germanium-on-insulator portion in a second annealing step to relaxed the SiGe layer; and depositing a layer of strained silicon about the SiGe layer.

18 Claims, 13 Drawing Sheets

U.S. PATENT DOCUMENTS

| | | | |
|---|---|---|---|
| 6,852,652 B1* | 2/2005 | Maa et al. | 438/197 |
| 6,992,025 B1* | 1/2006 | Maa et al. | 438/795 |
| 2002/0168802 A1* | 11/2002 | Hsu et al. | 438/149 |

OTHER PUBLICATIONS

Z. Cheng et al., *Relaxed Ssilicon-Germanium on Insulator Substrate by Layer Transfer*, Journal of Electronics Materials, vol. 30, No. 12, 2001, L37.

G. Taraschi et al., *Relaxed SiGe on Insulator Fabricated via Wafer Bonding and Layer Transfer: Etch-back and Smart-Cut Alternatives*, Electrochemical Society Proceedings vol. 2001-3, p. 27.

L.-J. Huang et al., *Carrier Mobility Enhancement in Strained Si-on-Insulator Fabricated by Wafer Bonding*, 2001 Symposium on VLSI Technology Digest of Technical Papers, p. 57.

7. T.A. Langdo et al., *Preparation of Novel SiGe-Free Strained Si on Insulator Substrates*, 2002 IEEE International SOI Conference Proceedings, Oct. 2001, p. 211.

H. Yin et al., *Strain relaxation of SiGe islands on compliant oxide*, Journal of Applied Physics, 91, 2002, 9718.

* cited by examiner

METHOD OF MAKING RELAXED SILICON-GERMANIUM ON INSULATOR VIA LAYER TRANSFER WITH STRESS REDUCTION

FIELD OF THE INVENTION

This invention relates to high speed CMOS integrated circuits, and specifically to an efficient fabrication method for formation of a relaxed SiGe layer on an oxide insulator.

BACKGROUND OF THE INVENTION

In strained silicon CMOS, the carrier transport properties are enhanced by the biaxial tensile strain in the strained silicon layer on relaxed SiGe. Strained silicon MOSFETs have been demonstrated on SiGe-on-insulator (SGOI) substrates with the combination of the high mobility in strained silicon and advantages of SOI structures in sub-100 nm devices. K. Rim et al., *Strained Si for sub-100 nm MOSFETs*, Proceedings of the 3rd International Conference on SiGe Epitaxy and Heterostructures, Sante Fe, New Mexico, Mar. 9–12, 2002, p125.

Methods to fabricate SiGe-on-insulator substrate have been reported by the MIT group and IBM. Transfer of SiGe onto insulator substrate was achieved by Smart-Cut technique through hydrogen implantation and annealing. M. Bruel et al., *Smart-Cut: A New Silicon On Insulator Material Technology Based on Hydrogen Implantation and Wafer Bonding*, Jpn. J. Appl. Phys., Vol. 36, 1636 (1997); Z.-Y. Cheng et al., *SiGe-on insulator (SGOI)*: Substrate Preparation *and MOSFET Fabrication for Electron Mobility Evaluation*, 2001 IEEE International SOI Conference Proceedings p 13; Z. Cheng et al., *Relaxed Silicon-Germanium on Insulator Substrate by Layer Transfer*, Journal of Electronics Materials, Vol. 30, No. 12, 2001, L37; and G. Taraschi et al., *Relaxed SiGe on Insulator Fabricated via Wafer Bonding and Layer Transfer: Etch-back and Smart-Cut Alternatives*, Electrochemical Society Proceedings Vol. 2001–3, p27; and L.-J. Huang et al., *Carrier Mobility Enhancement in Strained Si-on-Insulator Fabricated by Wafer Bonding*, 2001 Symposium on VLSI Technology Digest of Technical Papers, p 57.

In the prior art, a thick layer SiGe is deposited on a silicon substrate, which includes a graded SiGe buffer layer and a relaxed SiGe layer having a constant germanium concentration. Following surface planarization, as by CMP, hydrogen is implanted into the SiGe layer to facilitate wafer splitting. The Si/SiGe wafer is then bonded to a oxidized silicon substrate. The SiGe-on-oxide is separated from the rest of the couplet by thermal annealing, wherein splitting occurs along hydrogen-implantation-induced microcracks, which parallel the bonding interface.

A technique to form a SiGe-free strained silicon on insulator substrates has been also reported by T. A. Langdo et al., *Preparation of Novel SiGe-Free Strained Si on Insulator Substrates*, 2002 IEEE International SOI Conference Proceedings, October 2001, p211. This technique is similar to previously described techniques, except that a thin layer of epitaxial silicon is deposited on the SiGe layer before wafer bonding. After bonding and wafer splitting, the SiGe layer is removed by oxidation and HF etching, enabling the formation of very thin and uniform strained silicon on oxide surface.

The above techniques all involve thicker SiGe layer, and require one or two elaborate CMP process. The relaxation of SiGe on borophosphorosilicate glass (BPSG) after film transfer and island formation. H. Yin et al., *Strain relaxation of SiGe islands on compliant oxide*, Journal of Applied Physics, 91, 2002, 9718.

SUMMARY OF THE INVENTION

A method of forming a silicon-germanium layer on an insulator includes preparing a silicon substrate; depositing a layer of silicon-germanium on the silicon substrate to form a silicon/silicon-germanium portion having a SiGe/silicon interface; implanting hydrogen ions into the silicon substrate between about 500 Å to 1 μm below the silicon-germanium/silicon interface; preparing an insulator substrate; bonding the silicon/silicon-germanium portion to the insulator substrate with the silicon-germanium layer in contact with the insulator substrate to form a couplet; thermally annealing the couplet in a first thermal annealing step to split the couplet into a silicon portion and a silicon-germanium-on-insulator portion; patterning and etching the silicon-germanium-on-insulator portion to remove portions of the silicon and SiGe layers; etching the silicon-germanium-on-insulator portion to remove the remaining silicon layer; thermally annealing the silicon-germanium-on-insulator portion in a second annealing step to relaxed the SiGe layer; and depositing a layer of strained silicon about the SiGe layer.

It is an object of the invention to fabricate a relaxed SiGe layer on an insulator without the need of forming a thick SiGe buffer layer, thereby eliminating a long SiGe deposition step and subsequent, elaborate CMP steps.

Another object of the invention is to provide a method of transferring a strained SiGe layer, or a strained SiGe layer covered with thin epitaxial silicon to an insulator, and specifically transferring a strained SiGe layer to a silicon oxide insulator.

Another object of the invention is to provide a relaxed silicon-germanium layer which is relaxed either during a film transfer step, or during a subsequent annealing step after wafer transfer.

Still another object of the invention is to provide a method of forming a silicon germanium film by a process which is simpler, cheaper, and results in fewer film defects than prior art techniques.

This summary and objectives of the invention are provided to enable quick comprehension of the nature of the invention. A more thorough understanding of the invention may be obtained by reference to the following detailed description of the preferred embodiment of the invention in connection with the drawings.

DETAILED DESCRIPTION OF THE PREFERRED EMBODIMENTS

The purpose of this invention is to fabricate a relaxed SiGe layer on an insulator without the need of forming a thick SiGe buffer layer, thereby eliminating a long SiGe deposition step and subsequent, elaborate CMP steps. The film to be transferred is a strained SiGe layer, or a strained SiGe layer covered with thin epitaxial Si. Relaxation occurs either during a film transfer step, or during a subsequent second annealing step after wafer transfer. The process is simpler, cheaper, and results in fewer film defects than prior art techniques.

The method of the invention provides a technique using a relatively thin SiGe layer, which does not require CMP before wafer bonding or after wafer splitting. The method of the invention includes direct transfer of SiGe onto a thermal oxide, which method is more compatible with current IC fabrication processes, and much easier to incorporate in CMOS fabrication.

Figure 1:
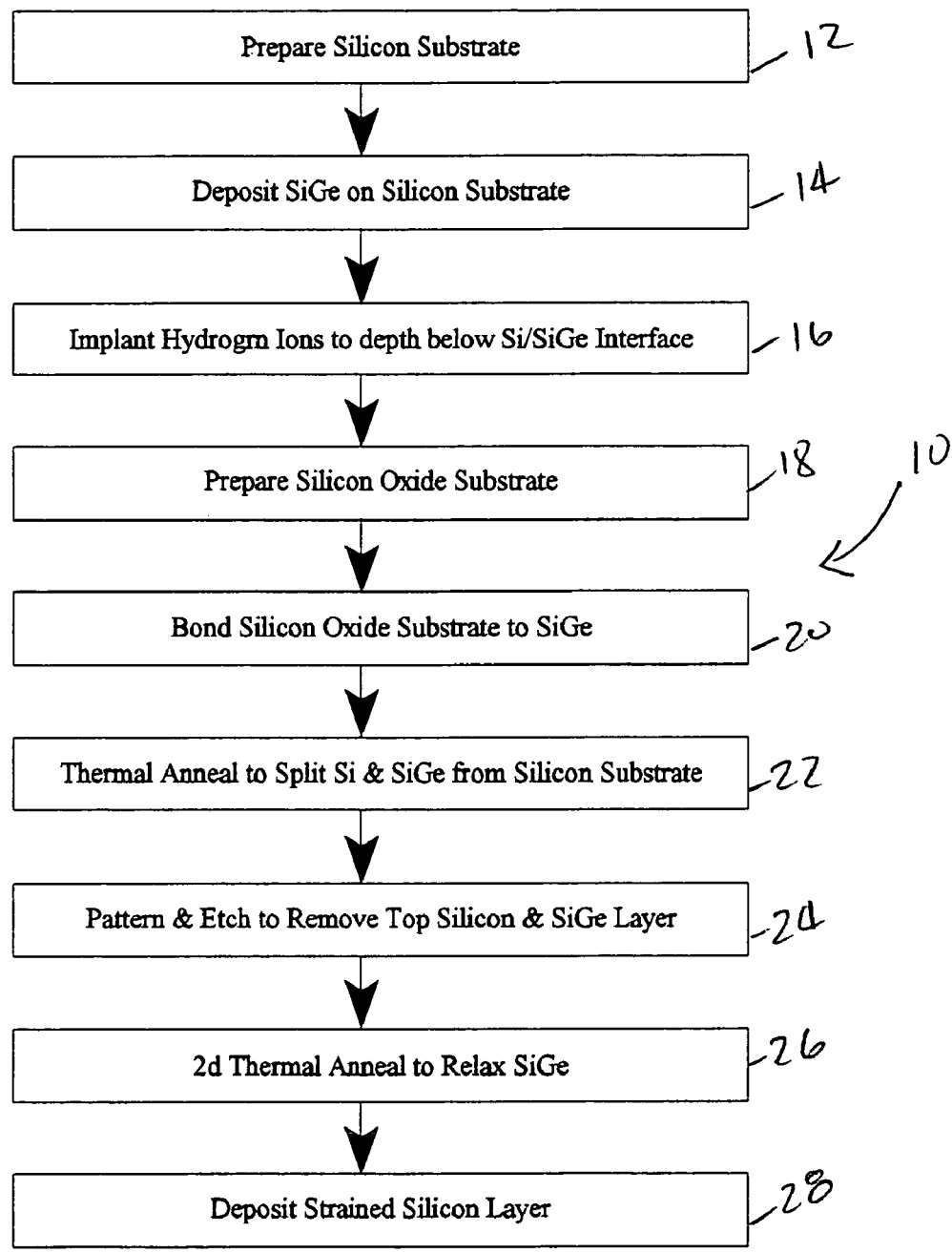
FIG. 1 is a block diagram of the method of the invention.

The process steps are described as follows, and now referring to FIG. 1, the steps of the method of the invention are depicted generally at 10:

A silicon substrate is prepared, block 12, and a layer of SiGe is deposited on the silicon substrate, block 14. Hydrogen ions are implanted, block 16, wherein the depth of hydrogen is below the SiGe/Si interface by a depth of between about 200 Å to 1 µm, block below the SiGe/Si interface. The hydrogen implanted, SiGe on silicon substrate is referred to herein as the SiGe portion.

A silicon substrate is again prepared, and thermally oxidized to form a $SiO_2$ layer on the substrate, which is referred to herein as an oxide portion, block 18.

The SiGe portion is bonded to the oxide portion, block 20, with the SiGe layer in contact with the $SiO_2$, forming a combined structure, also referred to herein as a couplet, or bonded entity.

The couplet is split by a first thermal annealing step, block 22, at temperature of between about 350° C. to 550° C., producing two modified portions: a SiGe-on-oxide portion, or SiGe-on-insulator portion, and a silicon portion.

The SiGe on oxide portion is patterned and etched to remove a portion of the now top silicon layer and SiGe layer, then etched to remove the remaining top silicon, block 24.

A second anneal step, block 26, is performed to relax the SiGe film. A layer of strained silicon is deposited on the relaxed SiGe layer, block 28.

Figure 2:
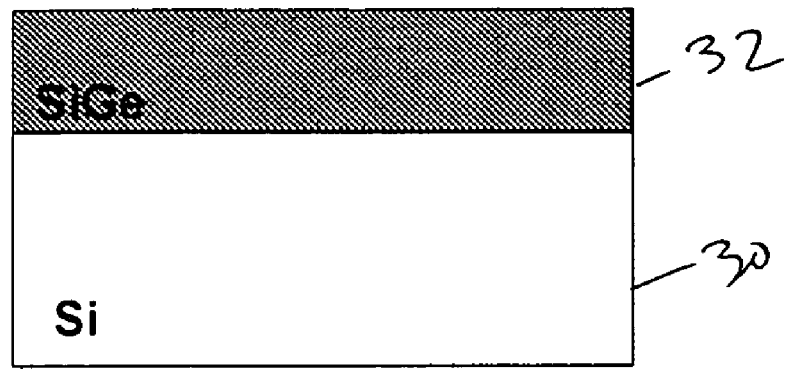
FIGS. 2–9 depict steps in the method of the invention.

Referring now to FIG. 2, a silicon substrate 30 is prepared, and a layer 32 of SiGe is epitaxially deposited on silicon wafer. The germanium concentration is in the range of between about 10% to 60%, and can be graded or uniform throughout. The SiGe thickness is between about 20 nm to 1000 nm. SiGe is under biaxial compression strain and no relaxation occurs at this time.

Figure 3:
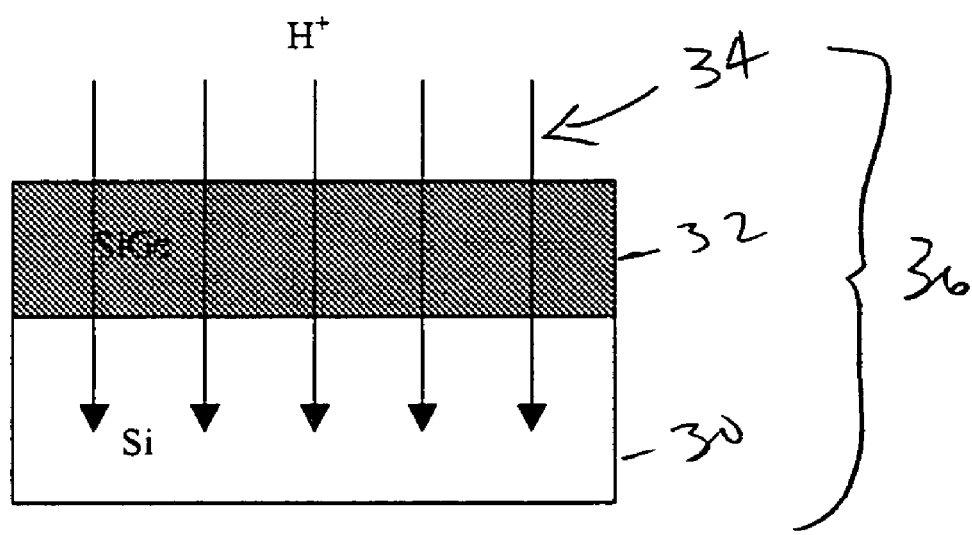

FIG. 3 depicts the hydrogen ion 34 implantation step, wherein hydrogen ions, either $H^+$ or $H_2^+$, are implanted through the SiGe film. The dose range is between about $1\times10^{16}$ $cm^{-2}$ to $5\times10^{17}$ $cm^{-2}$, and the energy range is between about 1 keV to 300 keV. Other gases, e.g., Ar, He, B may be used or combined. The range of hydrogen is below the SiGe layer, from 200 Å to 1µ below the SiGe/Si interface. The implanted hydrogen ions form a hydrogen region 34, having silicon substrate 30 on either side thereof. This structure is referred to herein as the SiGe portion 36.

The reason to implant hydrogen deep into the silicon region underlying the SiGe is to reduce the stress of the transferred film. The silicon on top of the SiGe helps to reduce the total stress of the film structure. Without this top silicon layer, because of the high stress of the SiGe layer, film tends to wrinkle or buckle up after SiGe transfer.

Figure 4:
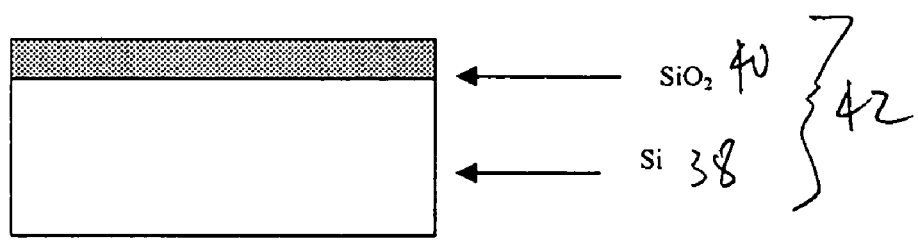

FIG. 4 depicts preparation of another, or second, silicon substrate 38, which is thermally oxidized to produce a $SiO_2$ layer 40 over silicon substrate, the oxide portion 42.

Figure 5:
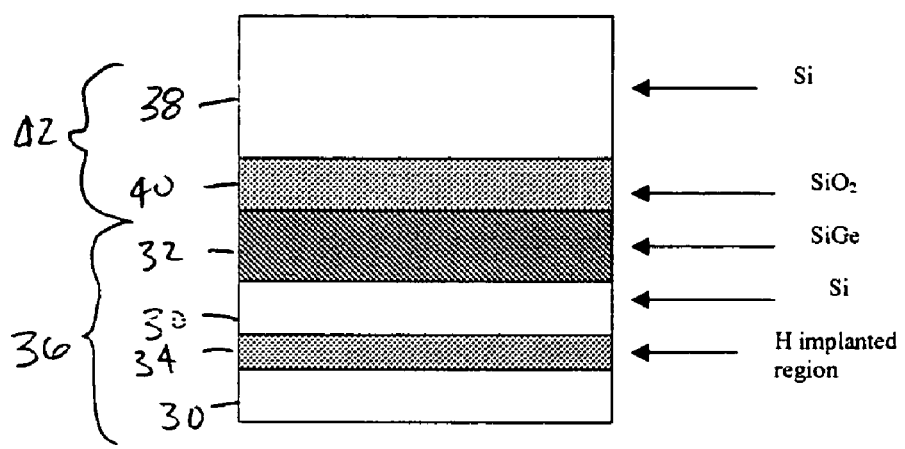

FIG. 5 depicts the bonding of SiGe portion 36 to oxide portion 42. The couplet is formed by direct wafer bonding. In direct wafer bonding, the surfaces of both portions are cleaned in a modified SC-1 ($H_2O:H_2O_2:NH_4OH=5:1:1$) cleaning solution and rinsed in distilled water. After drying, at less than 90° C., both surfaces are hydrophilic. The dried, hydrophilic-exposed portions facing one another, are brought into contact at ambient temperature. The bonding is initialized in a small area of the touching wafers by pressing the wafers together to squeeze out trapped air. The bonded area quickly spreads over the entire in-contact surfaces, within a few seconds. The now bonded entity is cured at a temperature of between about 150° C. to 250° C. for between about one hour to fourteen hours.

Figure 6:
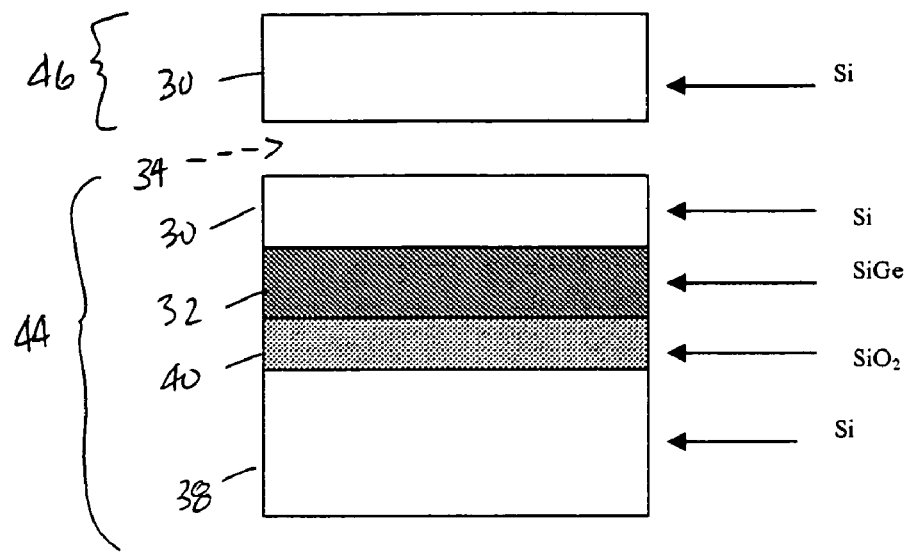

FIG. 6 depicts wafer splitting by thermal annealing at a temperature of between about 350° C. to 700° C. for between about 30 minutes to four hours, to separate the SiGe portion along the hydrogen implant region from silicon substrate, resulting in a SiGe layer-on-oxide portion, also referred to herein as the SiGe-oxide portion, 44 and a silicon portion 46.

Figure 7:
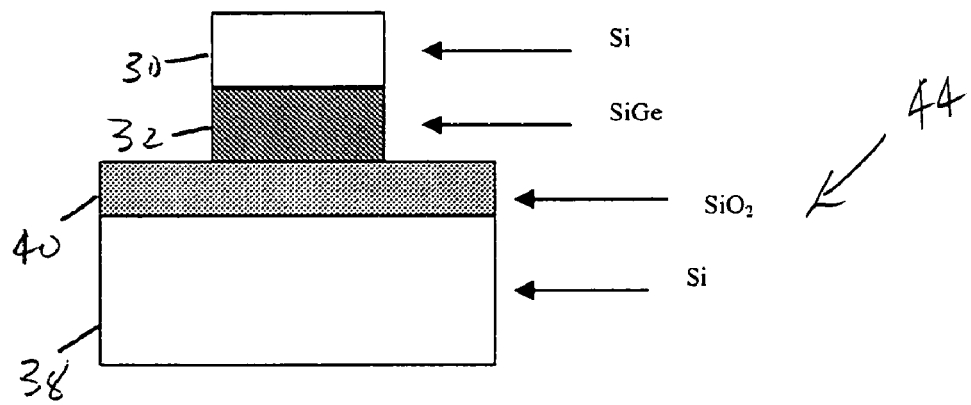
Figure 8:
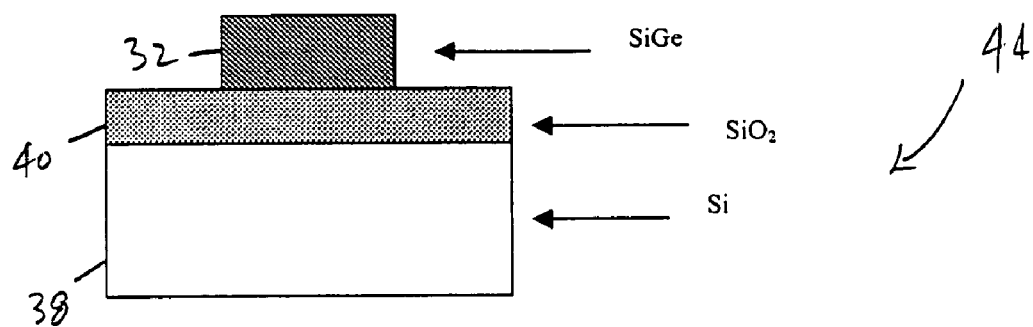

Silicon layer 30 and SiGe layer 32 on SiGe-oxide portion 44 are patterned and etched, FIG. 7, removing portions of the silicon and SiGe, then top silicon layer 30 is etched and removed, FIG. 8.

Figure 9:
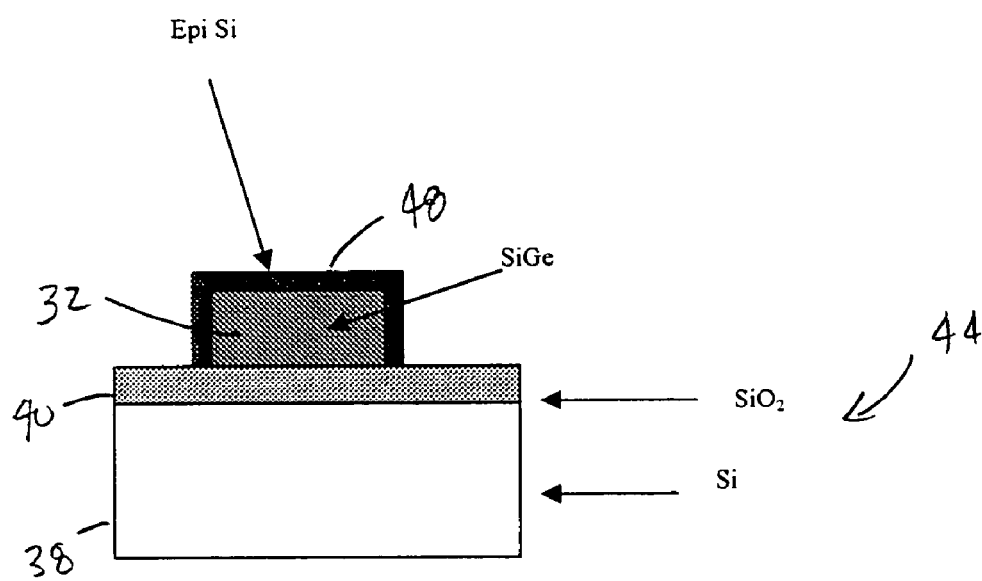

The second annealing step, FIG. 8, is performed to relax the SiGe layer, at a temperature of between about 600° C. to 900° C. for between about ten minutes to sixty minutes, in an inert atmosphere. Finally, a layer of strained silicon 48 is epitaxially deposited about the SiGe layer, to a thickness of between about 10 nm to 30 nm, by CVD, molecular beam epitaxy, or other suitable deposition technique, at a temperature of between about 450° C. to 800° C., FIG. 9.

Figure 10:
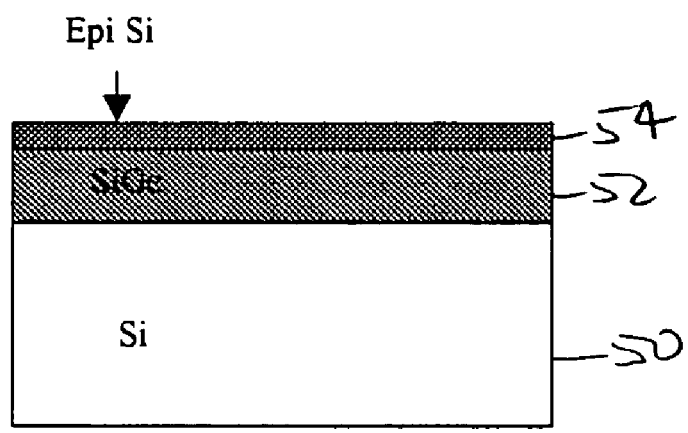
FIGS. 10–12 depict steps in an alternate embodiment of the method of the invention.
Figure 11:
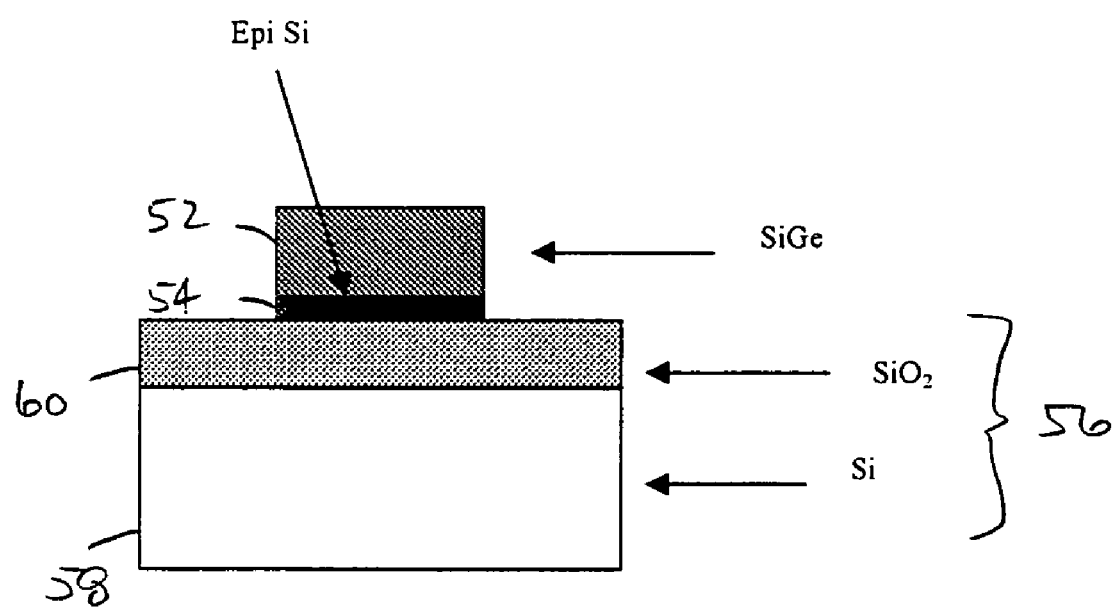
Figure 12:
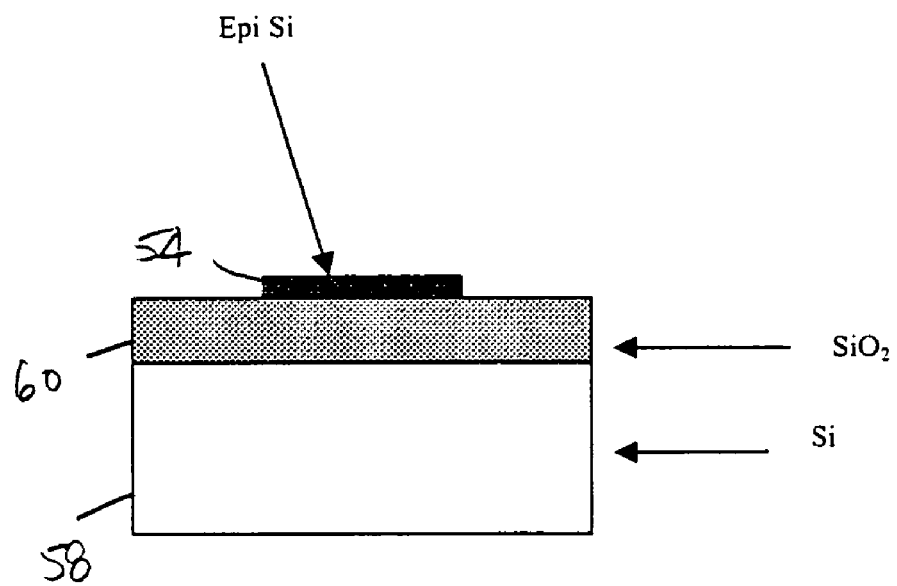

In an alternative method of the invention, a silicon substrate 50 is prepared, a layer 52 of SiGe is deposited, as in accordance with the first embodiment of the method of the invention, and a thin layer of epitaxial silicon 54 is deposited on SiGe layer 52, FIG. 10. After hydrogen implant, bonding to an oxide portion 56, having a silicon substrate 58 and a silicon oxide layer 60, wafer splitting, patterning and etching, and removing of top silicon layer 50, the structure is annealed to improve SiGe relaxation, thereby straining thin epitaxial silicon layer 54 underlying SiGe layer 52, FIG. 11. SiGe layer 52 is removed during an oxidation and etching step, leaving only thin strained silicon layer 54 on the oxide portion, FIG. 12.

Figure 13:
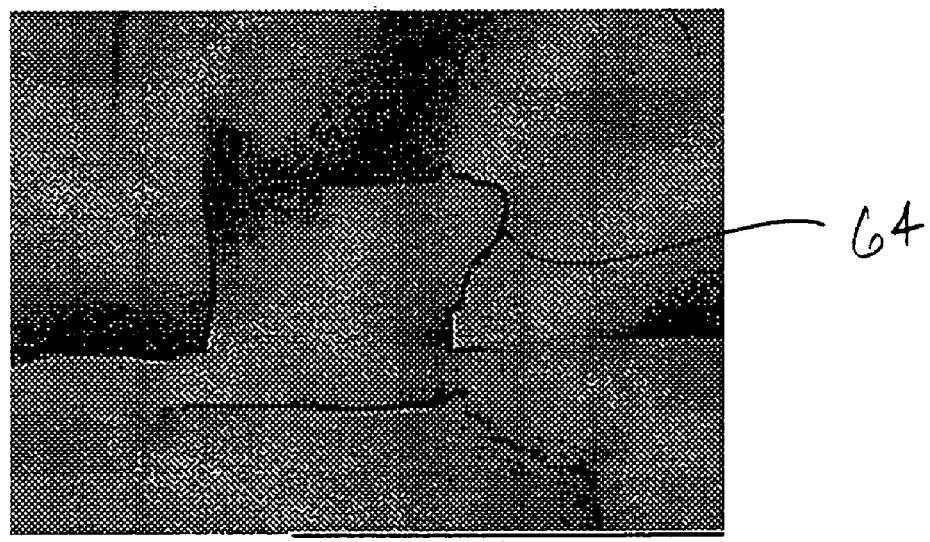
FIG. 13 depicts a SiGe layer after transfer to a silicon oxide substrate at 1000×.

A problem associated with convention deposition of strained SiGe and silicon is illustrated in FIG. 13, which is a 1000× photo of transferred SiGe on $SiO_2$ at temperature lower than 550° C. Because of the SiGe stress and low bonding energy, the SiGe layer buckles and wrinkles, 62, to relieve the stress.

At temperature higher than 650° C., no buckles or wrinkle appear, but the SiGe film exhibits blisters, as described later herein. An important feature of the method of the invention is simplification of the fabrication process to reduce the stress of the transferred SiGe/Si structure, so that the film may be transferred at lower temperature, such as 350° C. to 550° C., preventing formation of wrinkles, blisters and buckling.

After film transfer, the structure is patterned and etched into small feature. After silicon is removed, upon annealing the residual stress propagate to the edge of these small features, this prevents the formation of wrinkles or film buckling. Further relaxation can be achieved by annealing at higher temperature.

Transfer of SiGe onto Thermal Oxide

By directly attaching a layer of strained SiGe layer-on-insulator, proper relaxation of the SiGe layer occurs at the splitting anneal step. The strained SiGe layer may be either a graded SiGe layer or SiGe with fixed germanium content. The following is the result of attaching graded SiGe layer to thermal oxide. A relaxation of about 80% is achieved.

Figure 14:
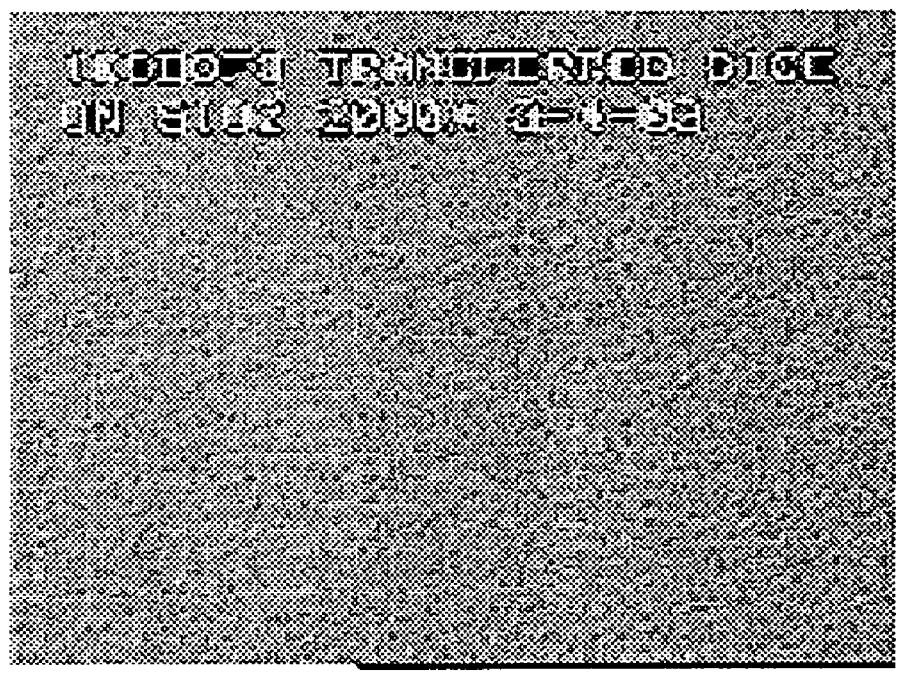
FIG. 14 is an enlarged photo of a SiGe surface fabricated according to the method of the invention.
Figure 15:
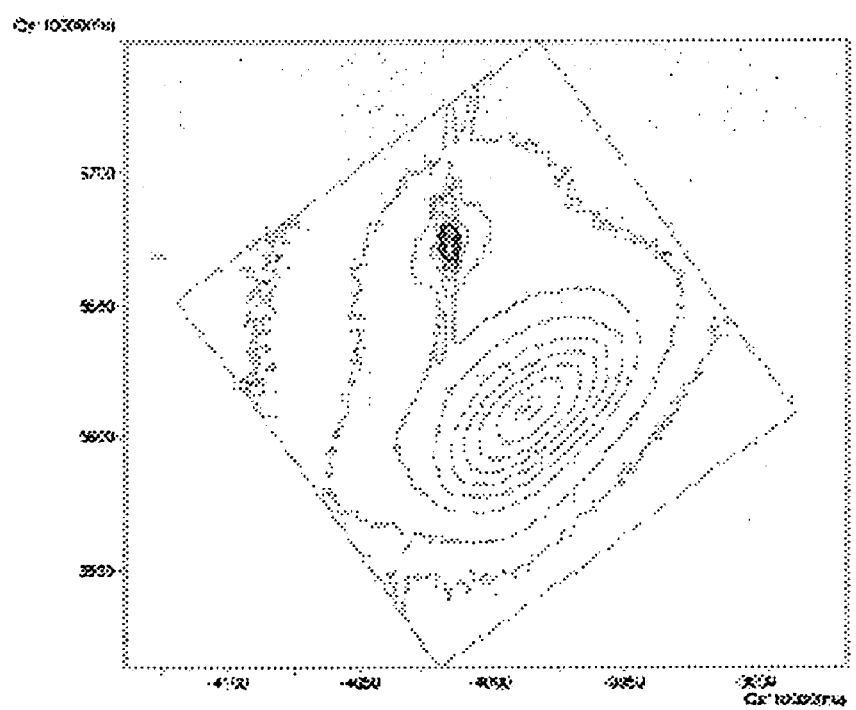
FIG. 15 is an XRD of a SiGe layer fabricated according to the method of the invention.
Figure 16:
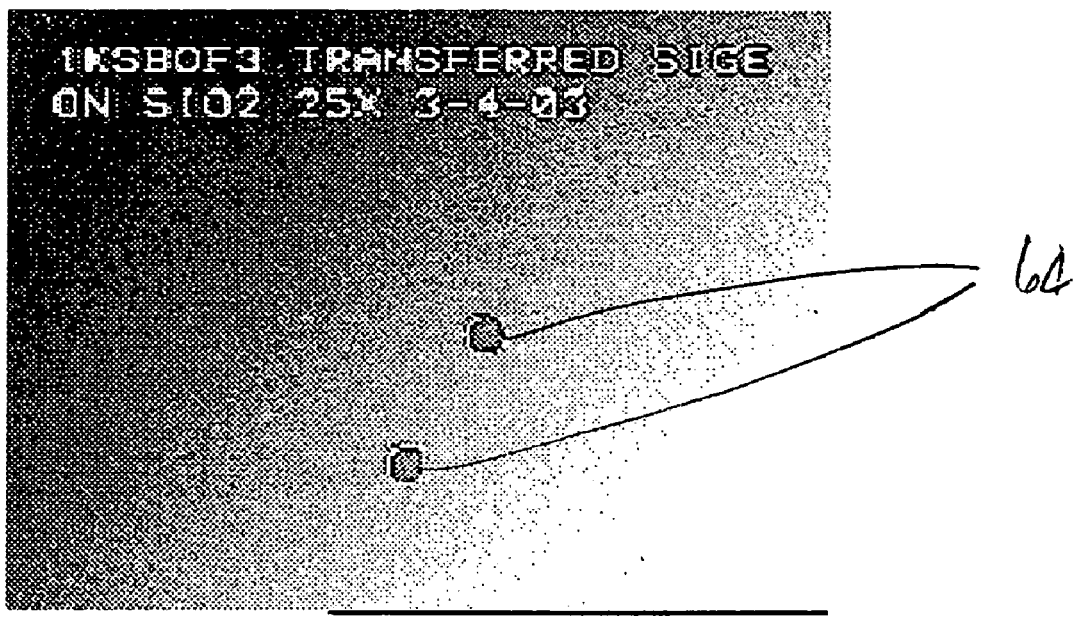
FIGS. 16 and 17 depict defects resulting from low annealing temperatures.
Figure 17:

FIG. 14 depicts SiGe on $SiO_2$/Si at 2000×, wherein the SiGe was transferred from a silicon portion sample by thermal anneal splitting at 650° C. for 60 minutes, with a 5 second ramp up. FIG. 15 depicts an XRD for the sample, where the peak FWHM parallel to surface=0.30°; SiGe (224) peak gives x=0.253, R=79%, however, because of the high stress of the attached SiGe, a surface blister, or flaking, is observed, as shown at 64 in FIG. 16, which is shown for the sample of FIG. 14 at 25×, and FIG. 17, which is shown at 200×.

Effect of SiGe Feature Size

Figure 18:
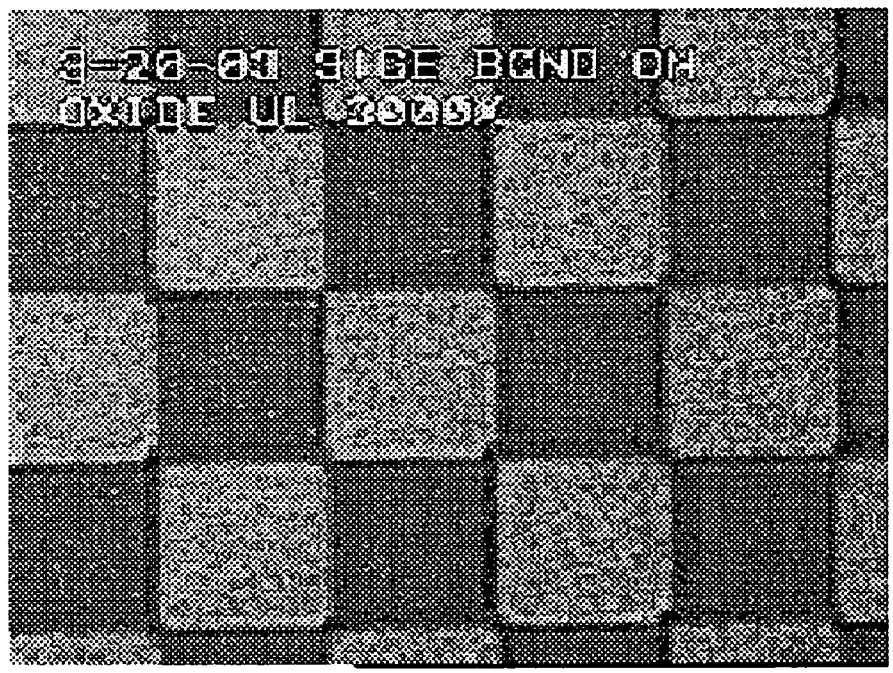
FIGS. 18 and 19 are enlarged photos of SiGe surface properly fabricated according to the method of the invention.
Figure 19:
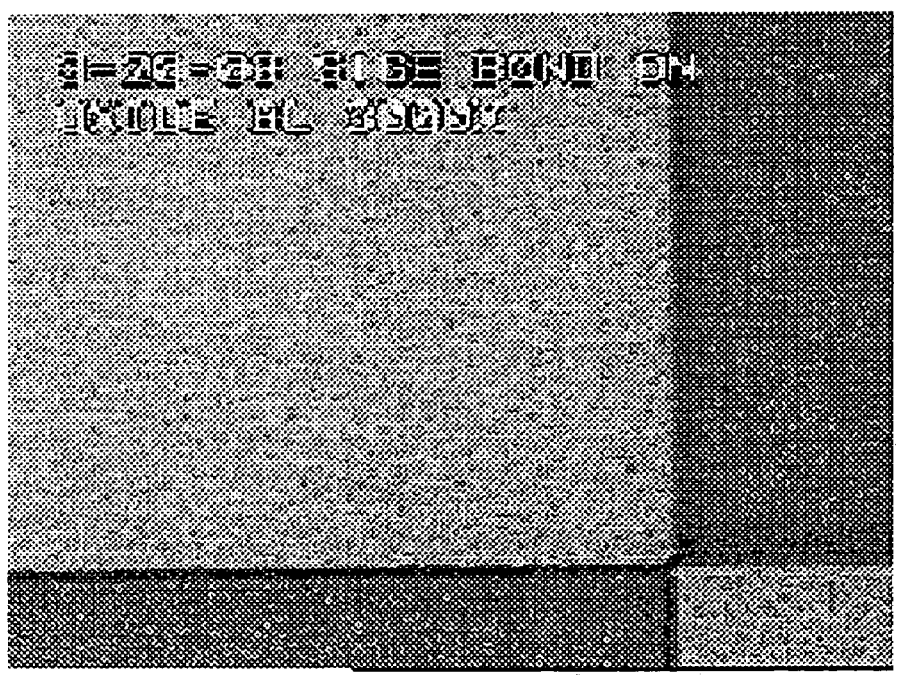

With the SiGe layer etched to different dimension, a successful transfer of SiGe is achieved, as shown in FIGS. 18, 19:

FIG. 18 is a 4 μm×4 μm SiGe pattern transferred to $SiO_2$ surface after splitting at 650° C.;

FIG. 19 is a 16 μm×16 μm SiGe pattern transferred to $SiO_2$ surface after splitting at 650° C.

Figure 20:
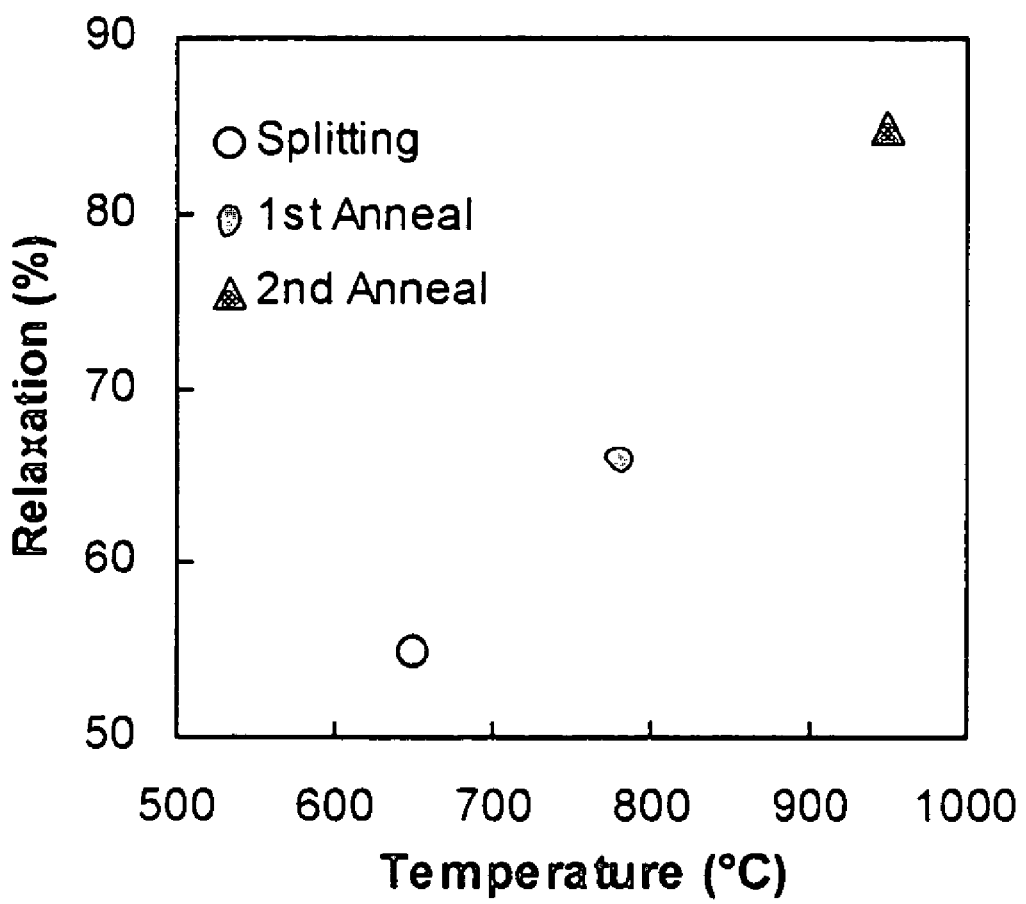
FIG. 20 depicts relaxation of a transferred SiGe layer at various annealing temperatures.

The relaxation of transferred layer is shown in FIG. 20, which depicts relaxation of a 16μ×16μ transferred checkerboard SiGe film, following a after 650° C. splitting (open circle); after an additional anneal at 780° C. for 1 hr (filled circle); and after an additional anneal at 950° C. for 30 min (triangle).

Figure 21:
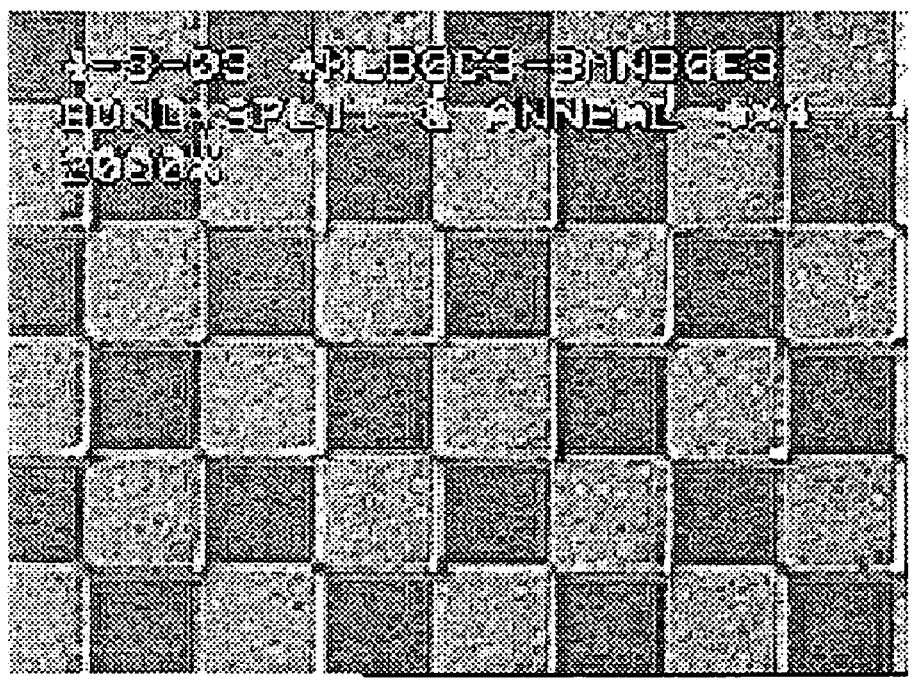
FIGS. 21–23 depict the surface of SiGe at various magnifications after a 950° C. anneal.
Figure 22:
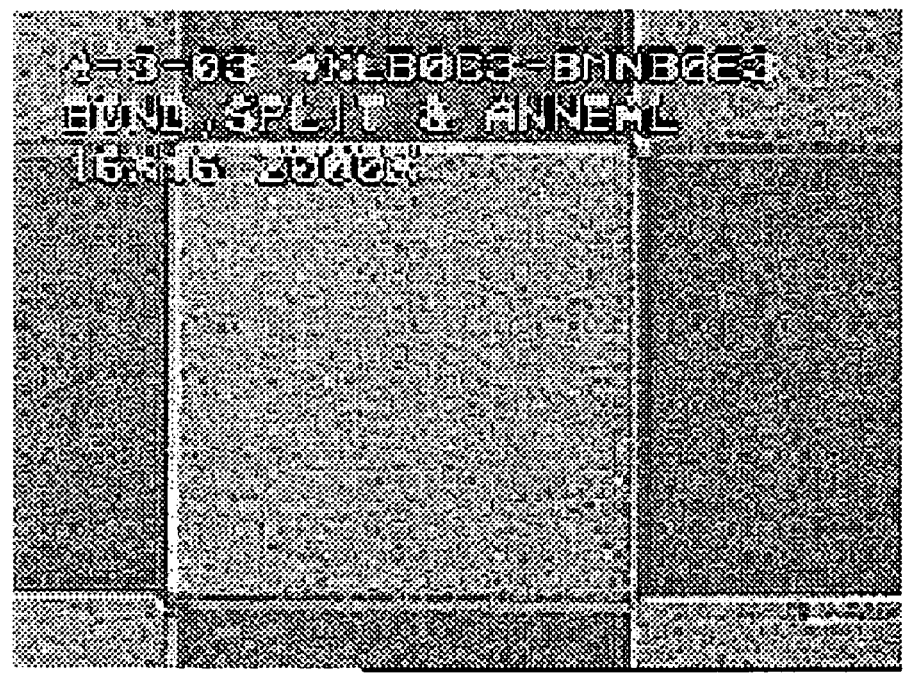
Figure 23:
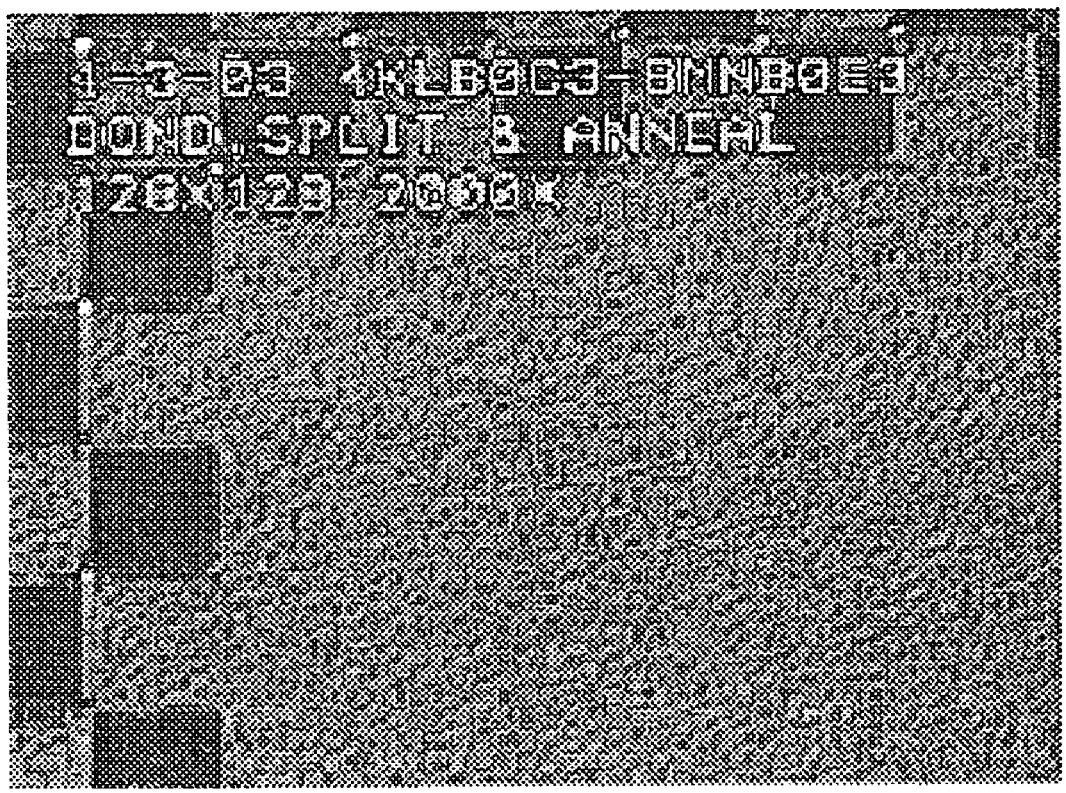

Relaxation of more than 85% may be achieved. This high relaxation is also observed on 4μ×4μ structure, as well as on plain SiGe area of >1 cm in size. The surface of SiGe after 950° C. anneal is shown in FIGS. 21–23: FIG. 21 depicts a 4×4 grid of SiGe on oxide after a 950° C. anneal; FIG. 22 depicts a 16×16 grid of SiGe on oxide after a 950° C. anneal; and FIG. 23 is an isolated 128μ×128μ square transferred onto $SiO_2$, after a 950° C. anneal, at higher magnification.

Process Simplification by Controlling Stress of SiGe/Si Structure

To simplify the process, the stress of the SiGe/Si film is controlled by transfer of the SiGe film before etching into small feature, thus patterning and etching of the SiGe film is performed after the transfer of SiGe/Si structure, rather than prior to film transfer.

Thus, a method of making relaxed silicon-germanium on insulator via layer transfer with stress reduction has been disclosed. It will be appreciated that further variations and modifications thereof may be made within the scope of the invention as defined in the appended claims.

We claim:

1. A method of forming a silicon-germanium layer on an insulator, comprising:

preparing a silicon substrate;

depositing a layer of silicon-germanium on the silicon substrate to form a silicon/silicon-germanium portion having a SiGe/silicon interface;

implanting hydrogen ions into the silicon substrate between about 200 Å to 1 μm below the silicon-germanium/silicon interface;

preparing an insulator substrate;

bonding the silicon/silicon-germanium portion to the insulator substrate with the silicon-germanium layer in contact with the insulator substrate to form a couplet;

thermally annealing the couplet in a first thermal annealing step to split the couplet into a silicon portion and a silicon-germanium-on-insulator portion;

patterning and etching the silicon-germanium-on-insulator portion to remove portions of the silicon and SiGe layers;

etching the silicon-germanium-on-insulator portion to remove the remaining silicon layer;

thermally annealing the silicon-germanium-on-insulator portion in a second annealing step to form a relaxed SiGe layer; and depositing a layer of strained silicon about the SiGe layer.

2. The method of claim 1 which further includes depositing an epitaxial silicon layer on the hydrogen-implanted silicon germanium layer before said bonding; and removing the silicon germanium layer from the silicon-germanium-on-insulator portion before said second thermal annealing.

3. The method of claim 1 wherein said preparing an insulator substrate includes preparing a silicon oxide-on-silicon substrate.

4. The method of claim 1 wherein said depositing a layer of silicon-germanium on the silicon substrate includes depositing a layer of silicon-germanium to a thickness of between about 20 nm to 100 nm at a germanium concentration of between about 10% to 60%, and wherein the germanium concentration is distributed in the layer taken from the group of distributions consisting of uniform distribution and graded distribution.

5. The method of claim 1 wherein said implanting hydrogen ions in the silicon-germanium layer includes implanting hydrogen ions taken from the group of hydrogen ions consisting of $H^+$ ions and $H_2^+$ ions, at an ion dose of between about $1·10^{16}$ cm$^{-2}$ and $5·10^{17}$ cm$^{-2}$ at an energy of between about 1 keV to 300 keV.

6. The method of claim 5 which includes implanting ions taken from the group of ions consisting of hydrogen, argon, helium and boron.

7. The method of claim 1 wherein said bonding the silicon/silicon-germanium portion to the insulator substrate with the silicon-germanium layer in contact with the insulator substrate to form a bonded entity includes bonding by direct wafer bonding.

8. The method of claim 1 wherein said curing the bonded entity includes curing the bonded entity at a temperature of between about 150° C. to 250° C. for a time of between about one hours to fourteen hours.

9. The method of claim 1 wherein said thermally annealing the bonded entity includes annealing the bonded entity at a temperature of between about 350° C. to 700° C. for a time of between about thirty minutes to four hours.

10. The method of claim 1 wherein said second thermal annealing includes thermal annealing at a temperature of between about 600° C. to 900° C., for between about ten minutes to sixty minutes in an inert atmosphere.

11. The method of claim 1 wherein said depositing a layer of strained silicon includes depositing strained silicon to a thickness of between about 10 nm to 30 nm by a deposition technique taken from the group of deposition techniques consisting of CVD and molecular beam epitaxy at a temperature on a range of between about 450° C. to 800° C.

12. A method of forming a silicon-germanium layer on a silicon oxide-on-silicon substrate, comprising:
   preparing a silicon substrate;
   depositing a layer of silicon-germanium on the silicon substrate to form a silicon/silicon-germanium portion having a SiGe/silicon interface;
   implanting hydrogen ions into the silicon substrate between about 200 Å to 1 μm below the silicon-germanium/silicon interface;
   preparing a silicon oxide-on-silicon substrate;
   bonding the silicon/silicon-germanium portion to the silicon oxide-on-silicon substrate by direct wafer bonding with the silicon-germanium layer in contact with the silicon oxide to form a couplet;
   thermally annealing the couplet in a first thermal annealing step at a temperature of between about 350° C. to 700° C. for a time of between about 30 minutes to four hours to split the bonded entity into a silicon portion and a silicon-germanium-on-oxide portion;
   patterning and etching the silicon-germanium-on-oxide portion to remove portions of the silicon and SiGe layers;
   etching the silicon-germanium-on-oxide portion to remove the remaining silicon layer;
   thermally annealing the silicon-germanium-on-oxide portion in a second thermal annealing step to form a relaxed SiGe layer; and
   depositing a layer of strained silicon about the SiGe layer.

13. The method of claim 12 which further includes depositing an epitaxial silicon layer on the hydrogen-implanted silicon germanium layer before said bonding; and removing the silicon germanium layer from the silicon-germanium-on-oxide portion before said second thermal annealing.

14. The method of claim 12 wherein said depositing a layer of silicon-germanium on the silicon substrate includes depositing a layer of silicon-germanium to a thickness of between about 20 nm to 100 nm in biaxial compression strain form at a germanium concentration of between about 10% to 60%, and wherein the germanium concentration is distributed in the layer taken from the group of distributions consisting of uniform distribution and graded distribution.

15. The method of claim 12 wherein said implanting hydrogen ions in the silicon-germanium layer includes implanting hydrogen ions taken from the group of hydrogen ions consisting of $H^+$ ions and $H_2^+$ ions, at an ion dose of between about $1 \cdot 10^{16}$ $cm^{-2}$ and $5 \cdot 10^{17}$ $cm^{-2}$ at an energy of between about 1 keV to 300 keV.

16. The method of claim 15 which includes implanting ions taken from the group of ions consisting of hydrogen, argon, helium and boron.

17. The method of claim 12 wherein said second thermal annealing includes thermal annealing at a temperature of between about 600° C. to 900° C., for between about ten minutes to sixty minutes in an inert atmosphere.

18. The method of claim 12 wherein said depositing a layer of strained silicon includes depositing strained silicon to a thickness of between about 10 nm to 30 nm by a deposition technique taken from the group of deposition techniques consisting of CVD and molecular beam epitaxy at a temperature on a range of between about 450° C. to 800° C.

* * * * *